United States Patent
Leahey et al.

(12) 
(10) Patent No.: US 6,367,410 B1
(45) Date of Patent: Apr. 9, 2002

(54) CLOSED-LOOP DOME THERMAL CONTROL APPARATUS FOR A SEMICONDUCTOR WAFER PROCESSING SYSTEM

(75) Inventors: Patrick Leahey, San Jose; Jerry C. Chen, Sunnyvale; Richard E. Remington, Fremont; Simon Yavelberg, Cupertino, all of CA (US); Timothy Driscoll, Hamilton, MT (US); Robert E. Ryan, Sunnyvale, CA (US); Brian Hatcher, San Jose, CA (US); Rolf Guenther, Monte Sereno, CA (US); Xueyu Qian, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/947,174

(22) Filed: Oct. 8, 1997

Related U.S. Application Data

(63) Continuation-in-part of application No. 08/767,071, filed on Dec. 16, 1996, now abandoned.

(51) Int. Cl.[7] .............................................. C23C 16/507
(52) U.S. Cl. ...................... 118/723 I; 118/724; 118/58; 118/715
(58) Field of Search ........................ 165/39; 118/723 E, 118/725; 438/711; 219/405; 156/345

(56) References Cited

U.S. PATENT DOCUMENTS

| | | | | |
|---|---|---|---|---|
| 3,862,397 A | * | 1/1975 | Anderson et al. ............ | 219/405 |
| 4,858,557 A | * | 8/1989 | Pozzetti et al. .............. | 118/725 |
| 4,971,653 A | | 11/1990 | Powell et al. ................ | 156/626 |
| 5,097,890 A | * | 3/1992 | Nakao .......................... | 165/39 |
| 5,364,488 A | * | 11/1994 | Minato et al. ............... | 156/345 |
| 5,556,501 A | | 9/1996 | Collins et al. ............... | 156/345 |
| 5,614,055 A | | 3/1997 | Fairbairn et al. ........... | 156/345 |
| 5,656,334 A | | 8/1997 | Doi .............................. | 427/444 |
| 5,690,050 A | * | 11/1997 | Doi ......................... | 118/723 E |
| 5,846,883 A | * | 12/1998 | Moslehi ...................... | 438/711 |

* cited by examiner

*Primary Examiner*—Gregory Mills
*Assistant Examiner*—Rudy Zervigon
(74) *Attorney, Agent, or Firm*—Moser, Patterson, Sheridan; Joseph Bach

(57) ABSTRACT

A closed-loop, dome thermal control apparatus containing a high-volume fan, a heat exchange chamber, and an enclosure that encloses the fan and the heat exchange chamber. The fan blows air over a dome of a semiconductor wafer processing system and through the heat exchange chamber to uniformly control the temperature of a dome of a plasma chamber to prevent particle contamination of the wafer. The enclosure recirculates the temperature controlled air to the fan to form a closed-loop apparatus.

47 Claims, 14 Drawing Sheets

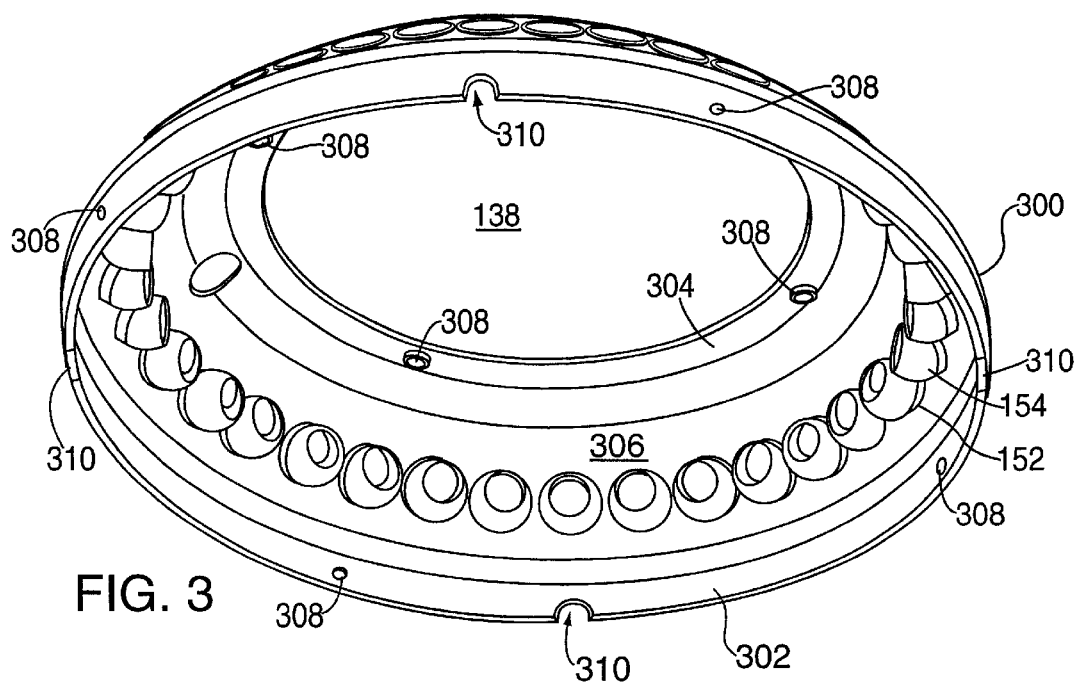
FIG. 3
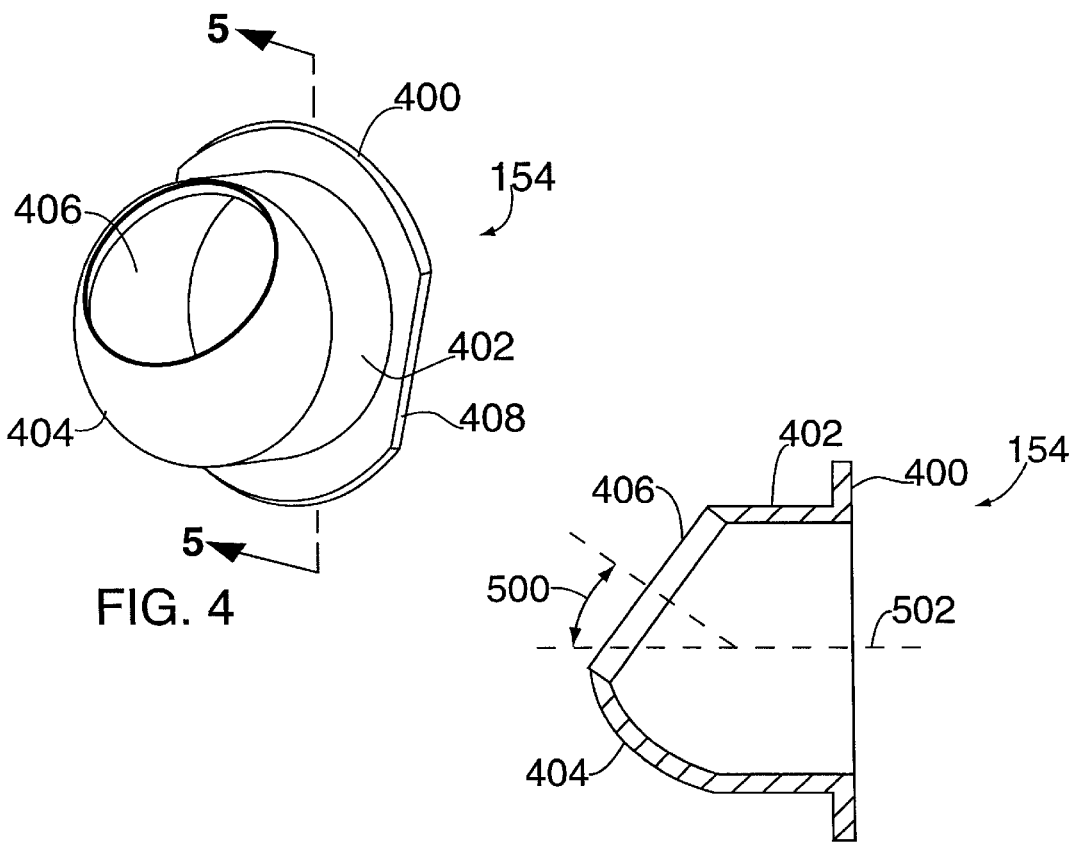
FIG. 4
FIG. 5

CLOSED-LOOP DOME THERMAL CONTROL APPARATUS FOR A SEMICONDUCTOR WAFER PROCESSING SYSTEM

CROSS-REFERENCE TO RELATED APPLICATIONS

The present application is a continuation-in-part application of co-pending U.S. patent application Ser. No. 08/767,071, filed Dec. 16, 1996 now abandoned.

BACKGROUND OF THE DISCLOSURE

1. Field of the Invention

The present invention relates to semiconductor wafer processing systems, and more particularly, to systems for etching semiconductor wafers in a thermally controlled environment.

2. Description of the Background Art

A semiconductor wafer processing system that performs dry etching of semiconductor wafers typically accomplishes the etching within a process chamber. The chamber is a vacuum sealed enclosure containing a wafer pedestal for mounting a wafer in a stationary position within the chamber during the etch process. To plasma enhance the etch process, a plasma is generated within the chamber by filling the chamber with a reactant gas, and applying a substantial RF field to the reactant gas to generate a plasma. The RF field is generated by conductive coils that circumscribe the outer circumference of the chamber as well as a cathode positioned within the chamber. These coils form an antenna that is driven by a high powered RF signal to produce a substantial magnetic field within the chamber. The cathode is also driven by an RF signal that produces a substantial electric field within the chamber. The magnetic and electric fields interact with the reactant gas to form a plasma within the chamber. The antenna is positioned at a location on the exterior of the chamber to ensure that the plasma is uniformly generated above the wafer surface that is to be etched.

To reduce the temperature change that is experienced by the chamber when the plasma is cycled on and off, the dome is typically heated to approximately 80° C. using a radiant heat lamp source. The radiant source is generally a plurality of high-power lamps mounted outside of the chamber. The lamps are mounted in an array above the dome. Typically, a reflector assembly is positioned proximate the lamps to focus their radiant energy upon the dome surface. To maintain the dome temperature at approximately 80° C. during plasma cycling (i.e., during periods when the plasma is present and not present), a fan is mounted proximate the dome to provide a continuous flow of room temperature air across the dome and thereby maintaining the dome at a constant temperature when the plasma is present. However, such a cooling technique is not very effective and the dome temperature may fluctuate as much as ±40° C. depending upon the ambient room temperature. Large thermal fluctuation of the chamber surfaces cause the chamber to expand and contract such that material deposited on the chamber walls and dome during the etch process flakes and falls upon the wafer being processed. The microcontamination particles makes the wafer unusable.

Therefore, a need exists in the art for a dome temperature control apparatus that maintains the temperature of the dome within at least ±5° C. of a preset nominal temperature during cycling of the plasma.

SUMMARY OF THE INVENTION

The disadvantages heretofore associated with the prior art are overcome by the present invention of a closed-loop dome temperature control apparatus. The apparatus contains a centrally-located, high-volume fan, a heat exchange chamber and an enclosure that encloses both the fan and the heat exchange chamber to form a closed-loop air flow circulation system. The closed loop system circulates air within the enclosure to stabilize the temperature of a dome of a semiconductor wafer processing system. To facilitate optimal air flow over the dome, the apparatus contains an air flow director.

In a first embodiment of the invention, the fan blows air from above a lamp assembly downward through a central portal defined by the lamp array assembly. The fan also blows air across the circumference of the lamp array assembly and through a vortex generator (one embodiment of an air flow director) containing a circular array of air directing nozzles. These nozzles direct the air flow toward the dome in a circular fashion generating a vortex or cyclone of air that swirls about the top of the dome. As the air swirls past the dome, it exits the edge of the dome into a heat exchange chamber wherein a plurality of tubes carrying a heat transfer fluid to chill or heat the air. The air passes through the heat exchange chamber over a fan shroud and back to the fan which again pushes the air down across the lamps and the upper portion of the dome. As such, a closed-loop, dome temperature control apparatus is produced.

In a second embodiment of the invention, an axial flow fan module blows air from above a lamp assembly through a central portal defined by the lamp assembly. The air flows through an air flow director containing a circular array of stationary air directing blades (i.e., stator blades).

These blades direct the air flow along an axial path toward the dome to provide a uniform cascade of air that, upon impact with the dome, flows radially outward over the top of the dome. As the air flows past the dome, it exits the edge of the dome into a heat exchange chamber wherein a plurality of finned tubes carry a heat transfer fluid to chill (or heat) the air. The air passes through the heat exchange chamber as the air flows back to the fan which again pushes the air down toward the center portion of the dome. A series of upper stator blades located above the fan are also utilized to prevent back flow of air from the axial fan.

Using this invention of a closed-loop apparatus, the dome temperature can be maintained to ±5° C., about a nominal temperature of 80° C. The temperature can further be controlled to raise or lower the nominal temperature by adjusting the power that is delivered to the lamps. The lamp control is facilitated by an infrared sensor that is focused upon the surface of the dome. The sensor signal is processed through a conventional software implementation of a feedback loop. The feedback loop utilizes a preset temperature value to which the measured temperature is compared. The closed loop system controls the current delivered to the infrared lamp array to cause the measured temperature to equal the preset temperature value.

BRIEF DESCRIPTION OF THE DRAWINGS

The teachings of the present invention can be readily understood by considering the following detailed description in conjunction with the accompanying drawings, in which:

FIG. 3 depicts a perspective view of a nozzle ring;

FIG. 4 depicts a perspective view of a nozzle ;

FIG. 5 depicts a cross-sectional view of the nozzle depicted in FIG. 4 taken along line 5—5;

To facilitate understanding, identical reference numerals have been used, where possible, to designate identical elements that are common to the figures.

DETAILED DESCRIPTION

Figure 1:
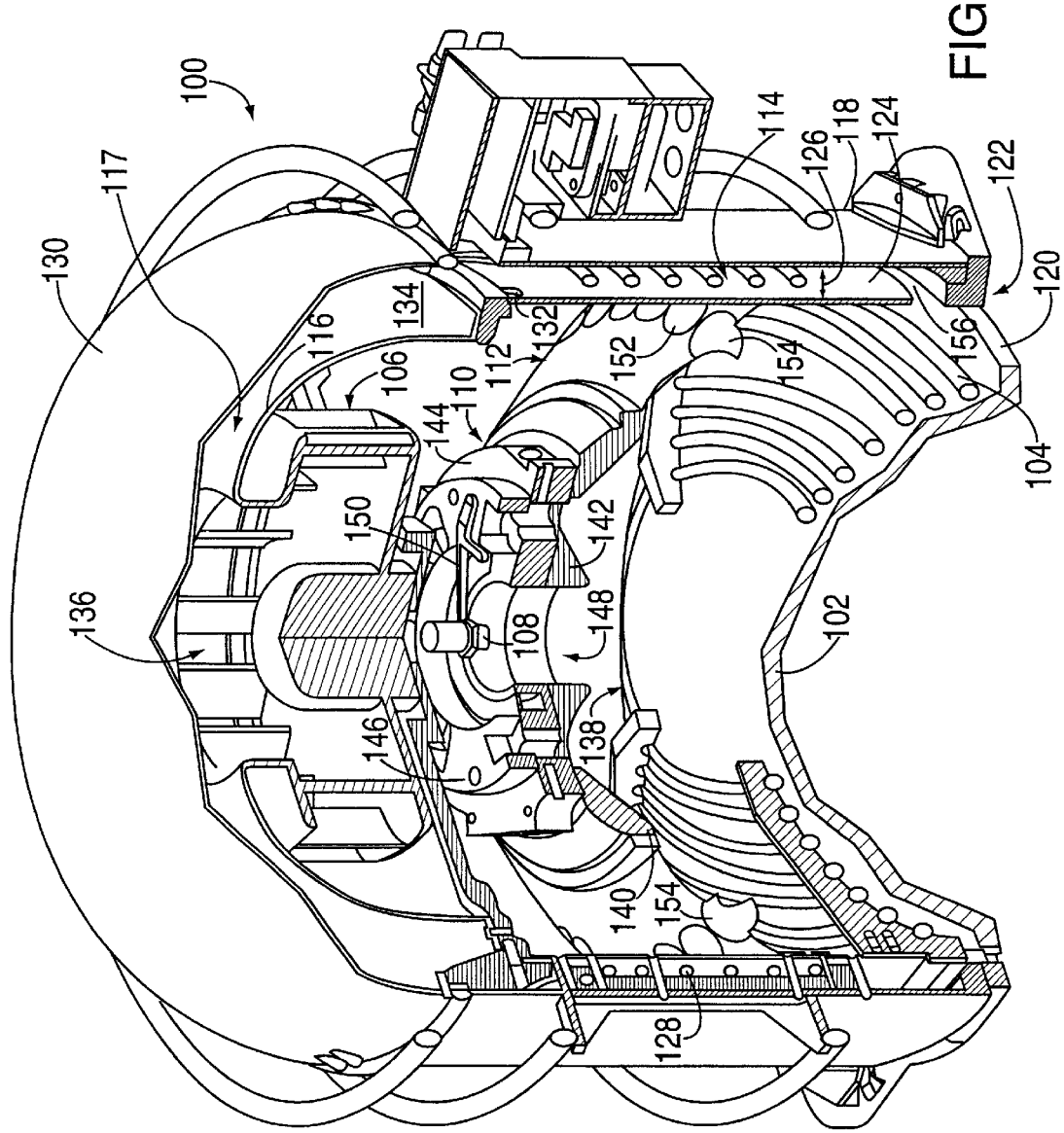
FIG. 1 depicts a partially sectional, perspective view of the present invention.

FIG. 1 depicts a partially sectional, perspective view of a closed-loop dome temperature control apparatus 100 of the present invention. The apparatus 100 is mounted above a conventional ceramic dome 102 of a plasma etch reaction chamber. The dome 102 is circumscribed by a inductively coupled coil 104, e.g., an antenna, that is conventionally driven with RF power to generate a magnetic plasma field within the chamber. The present invention maintains the surface of the dome at a relatively constant temperature whether a plasma is present in the reaction chamber or not.

Specifically, the apparatus 100 of a first embodiment of the present invention comprises a fan 106, an infrared sensor 108, a lamp assembly 110, a nozzle assembly 112, a heat exchange chamber 114, and a fan shroud 116. More specifically, the apparatus has an outer housing 118 that is substantially cylindrical and is attached to the circumferential edge 120 of the reaction chamber by a fastening assembly 122. The apparatus also contains a cylindrical shaped inner housing 124 that has a slightly smaller diameter than the outer housing 118. The inner and outer housings are concentric with respect to a central axis passing through the ceramic dome and reaction chamber. The inner and outer housings are in a spaced-apart relationship to define a space 126 there between. Within the space 126 is mounted a heat exchanger coil 128 such that the outer housing, inner housing and coil form the heat exchange chamber 114 or heat exchanger channel.

Upon the top edge of the outer housing is mounted a fan cover 130 that forms a closed loop circulatory system for the entire apparatus i.e., air circulating in the apparatus is not exhausted from the apparatus. To a top edge 132 of the inner housing 124 is mounted a fan shroud 116. The fan shroud 116 contains a central aperture 136 to which the fan 106 is mounted. As such, the fan 106 pulls air through the heat exchange chamber 114 through a space (air channel 117) between the fan cover 130 and the fan shroud 116 and into the central aperture 136 to be pulled through the fan 106.

The lamp assembly 110 is centrally mounted just below the fan within the apparatus 100. The lamp assembly 110 is maintained in place by the nozzle assembly 112. The nozzle assembly 112 is affixed to the inner surface of the inner housing 124 and extends inwardly at an angle toward the center of the apparatus 100. The nozzle assembly contains a central aperture 138. Upon an edge 140 that defines the central aperture 138 is mounted the lamp assembly 110. The lamp assembly 110 includes a lamp reflector 142, a lamp cooling plate 144, and a lamp mounting plate 146. The lamps themselves are not shown in FIG. 1 for simplicity. To provide cooling for the lamp assembly, the coolant, after passing through the heat exchanger coil 128, is channeled through passages in the lamp cooling plate 144. The lamp assembly is generally constructed and operates in a manner that is well-known in the art. The lamp reflector 142, the lamp cooling plate 144, and the lamp mounting plate 146 define a central aperture 148 that allows air to pass from the fan 106 toward the center of the dome 102. In other words, air passes along the central axis of the apparatus 100. Along that central axis is mounted the infrared sensor 108 having a mounting portion 150 attached to the lamp mounting plate 146 and extending into the central aperture 148. The infrared sensor that is positioned above the dome will sense an area of about 1.8 inches in diameter on the surface. This provides an accurate indication of the surface temperature of the dome.

The nozzle assembly 112 contains a plurality of apertures 152 about the circumference of the assembly. In each of those apertures 152 is positioned an air directing nozzle 154. Each nozzle has an axis that points air passing through the nozzle in a direction that is tangent to a circle that is coaxial with the center axis of the apparatus 100, where the circle has a diameter of 3 to 4 inches. Consequently, air flowing down from the fan 106 through central apertures 148 and 138 of the apparatus, as well as through each of the nozzles 154, forms a vortex or cyclone just above the ceramic dome 102. Consequently, this cyclone moves air across the dome toward the edge 120 thereof and effectively cools the dome. The air, as it passes over the dome 102, then exits the circumferential edge 120 of the dome through aperture 156 into the heat exchange chamber 114 and is returned to the fan 106 via channel 117. Consequently, the air is circulated over the dome 102 through the heat exchange chamber 114 and back to the fan 106 in a closed-loop path.

Figure 2:
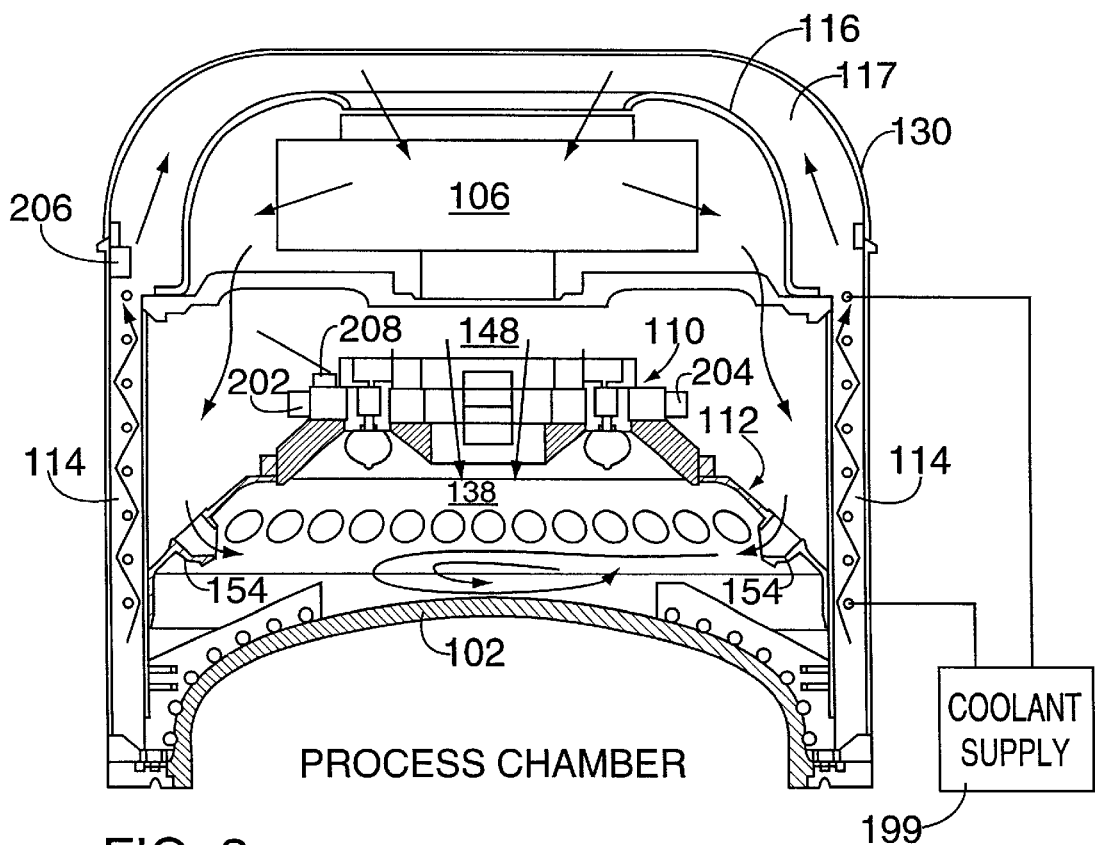
FIG. 2 depicts a cross-sectional view of the present invention.

Further, temperature control is provided by the infrared sensor 108 being attached to a feedback loop that controls lamp intensity. One example of such a feedback loop is described below with respect to FIGS. 6 and 7. FIG. 2 a depicts a cross-sectional view of the closed-loop, dome temperature control apparatus 100 showing the airflow paths through the apparatus as a plurality of arrows. The fan 106 pulls air through the channel 117 between the fan shroud 116 and the fan cover 130 at approximately 315 cfm. The fan, illustratively, is a backward curved motorized impeller fan produced by EBM Corporation. Without back pressure, such a fan can propel air at 710 cfm. The air is forced downward through central apertures 148 and 138 as well as through the air directing nozzles 154. As air passes through the nozzles, the angled nozzles produce a centrifugal air flow over the dome 102. The air then flows to the heat exchange chamber 114, rises through the chamber 114 due to the negative pressure of the fan 106. To achieve sufficient cooling of the air, the coolant coils are provided glycol from a coolant supply 199 (e.g., a refrigerator or heat exchanger) that maintains the coolant at approximately 10° C. The coolant is supplied at 40 to 60 psi to achieve a flow rate of approximately 0.4 to 0.6 gal/min. A schematic diagram of the coolant flow through the apparatus is shown in FIG. 8 below.

To provide further cooling, the coolant is also channeled through the lamp assembly 110. Specifically, the coolant flows through the cooling plate 144 of the lamp assembly. The coolant supply for the lamp assembly may be independent from the dome heat exchanger coils coolant supply. Optionally, the coolant may be channeled through the antenna coils. The antenna coils are hollow tubes that can be coupled to the coolant supply.

Once chilled, the fan pulls the air up into the air channel 117 between the fan shroud 116 and the fan cover 130 to once again push the cool air down over the lamp assembly 110 and through the nozzles 154 to complete a closed-loop air flow path. Such a centrifugal air flow pattern forms a vortex over the dome which pushes air from the inside, or central portion of the dome, to the outside portion of the dome, creating greater, and more uniform, air flow over the dome surface. Such a vortex of air better cools the dome surface than if the air were merely directed downward from the fan over the surface of the dome.

FIG. 3 is a perspective view of the nozzle assembly 112. The nozzle assembly 112 contains a nozzle ring 300 and a plurality of nozzles 154. The nozzle ring 300 contains a vertical portion 302 for mounting to the inner surface of the inner housing, a horizontal portion 304 for supporting the lamp assembly and defining the central aperture 138, and slanted portion 306 for interconnecting the vertical portion 302 with the horizontal portion 304. The slanted portion is slanted inward at approximately 45° from vertical. The vertical and horizontal portions 302 and 304 contain a plurality of mounting holes 308 and alignment slots 310. The slanted portion 306 nozzle ring 300 contains a plurality of apertures 152 (e.g., thirty-six apertures) formed in a ring about the circumference of the slated portion 306. Each aperture maintains a nozzle 154 in a particular orientation that is described in detail with respect to FIGS. 4 and 5 below.

FIG. 4 depicts a perspective view of the nozzle 154 and FIG. 5 depicts a cross-sectional view of a nozzle 154 taken along line 5—5 in FIG. 4. To best understand the invention, the reader should simultaneously refer to FIGS. 4 and 5. The nozzle 154 has a flange 400 for mounting against a nozzle ring aperture. A cylindrical nozzle portion 402 extends from the flange 400. The nozzle is formed at angle 500 with respect to a central axis 502 of the nozzle. As such, the orientation of the nozzle about the central axis 502 determines the angle of the air flow through the nozzle. The arcuate exhaust portion of the nozzle 404 defines an exhaust aperture 406.

The nozzles 154 are generally oriented within the ring such that they are offset from alignment with the center of the apparatus by 1 to 5 degrees. This alignment is achieved by an alignment flat 408. Each alignment flat abuts a neighboring flat assuring, once assembled, that all the nozzles are properly aligned. As such, the axis 500 extending through the center of the nozzle exhaust aperture 406 is tangent to a circle located just above the dome and having a 3 to 4 inch diameter. As such, simultaneous air flow through all thirty-six nozzles forms the air vortex over the dome.

The apparatus features a number of safety interlocks that are implemented to avoid injury or damage to the hardware. For example, in FIG. 2, an airflow sensor 200 is provided to trigger a shut-down of the RF power and the heating lamps in the event of a fan failure. The sensor is mounted to the housing assembly and contains an electronic air flow switch that opens the circuit should air flow subside. In addition, there are two over temperature sensors 202 and 204, located on the lamp assembly 110, which trigger the shut-down of the RF power and the lamp power in the event of overheating of the dome. Furthermore, there is an interlock switch 206 that senses the fan cover, the RF cable and the control cables such that removal of the cover or either of these cables will trigger a shut-down of the RF power, lamp power and the high voltage supply to the electrostatic chuck that retains a wafer within the etch chamber during electrochemical processing.

Figure 6:
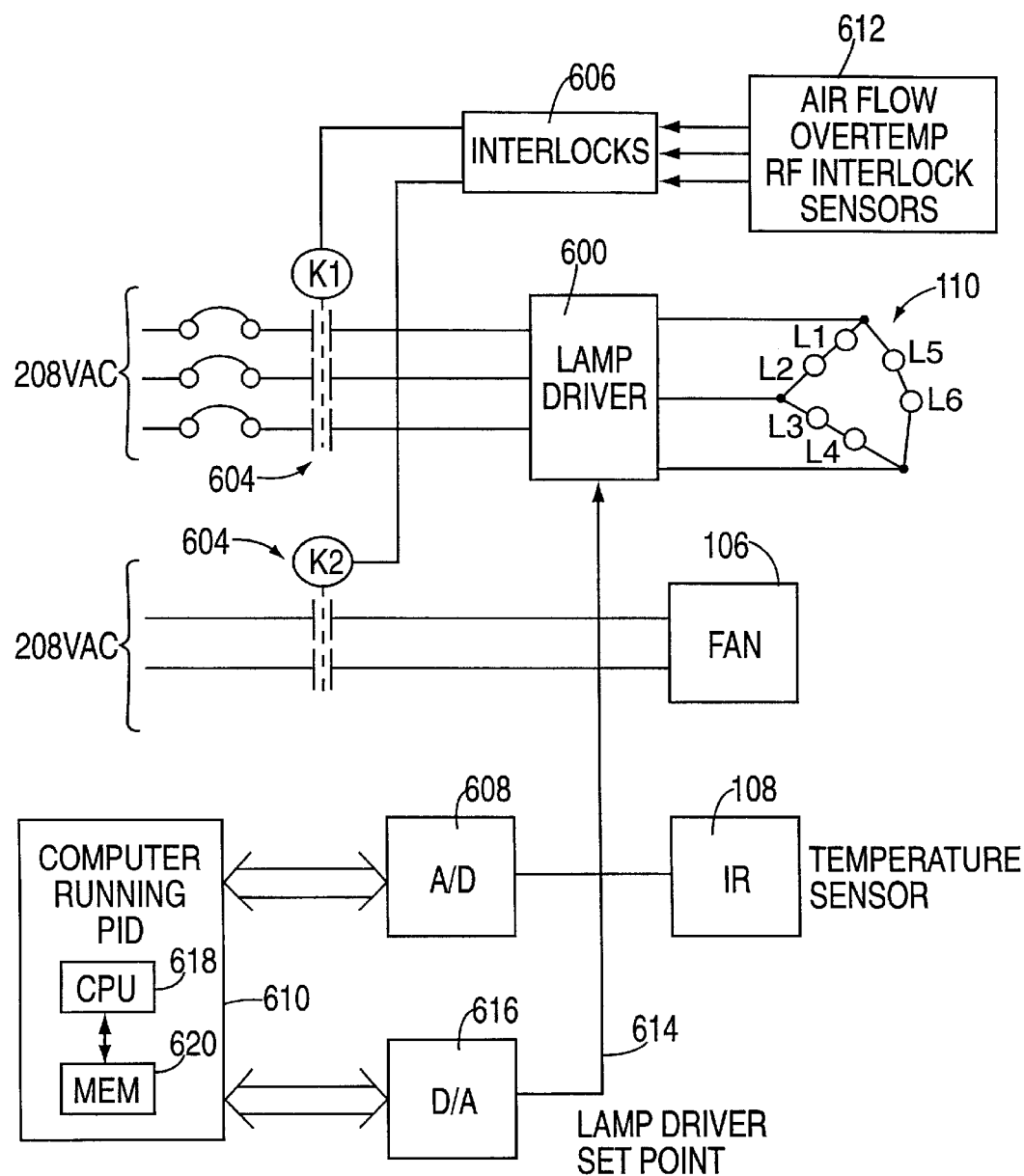
FIG. 6 depicts a schematic of the electrical circuitry of the present invention.

FIG. 6 depicts a schematic diagram of the electrical circuitry incorporated within the closed-loop dome temperature control apparatus of the present invention. The electronics include a lamp driver 600 for lamp array 110, the fan 106, the infrared temperature sensor 108, and a plurality of relays 604 for controlling power to the fan and to the lamp driver. A number of interlocks 606, which are controlled by sensors 612 that sense air flow, over-temperature and various interlocking switches, are used to control the relays 604. The interlocks 606 drive the relays 604 into a closed position such that power is supplied to the fan 106 and the lamp driver 600. More specifically, 31, 208 VAC is supplied to the lamp driver 600 which distributes the power to the six lamps L1–L6. Two lamps in series are connected to each phase, e.g., a delta arrangement. The array produce approximately 1,600 watts of power when driven with 208 VAC across each lamp pair. The voltage applied to the lamps is controlled by the lamp driver such that the lamp intensity is controllable. If a sensor 12 indicates an air flow problem, an over-temperature situation or an interlock being broken, the interlock 606 disconnects power from the relays 604. In response, the relays switch to a normally open position, disconnecting power from the lamp driver 600 and fan 106. Consequently, the dome thermal control apparatus is deactivated.

To control the dome temperature, an analog-to-digital converter 608 is used to convert the analog signal from the infrared temperature sensor 108 into a digital signal which is supplied to a computer 610. The computer 610 analyzes the temperature sensor signal to generate a lamp driver control voltage (path 614). This voltage is generated by the computer as a digital signal and is converted from digital to analog form in a digital-to-analog converter 616 and then sent to the lamp driver 600. This voltage forms the lamp driver set point such that the lamp driver, in response to this voltage, will alter the intensity of the lamp array to achieve a particular temperature as measured the temperature sensor.

The computer 610 is a general purpose computer containing a central processing unit 618 and a memory 620. The general purpose computer when executing a software program becomes a special purpose apparatus that implements the steps of the software program. One program executed by the computer is a routine for producing the lamp driver set point voltage, i.e., a temperature control routine.

Figure 7:
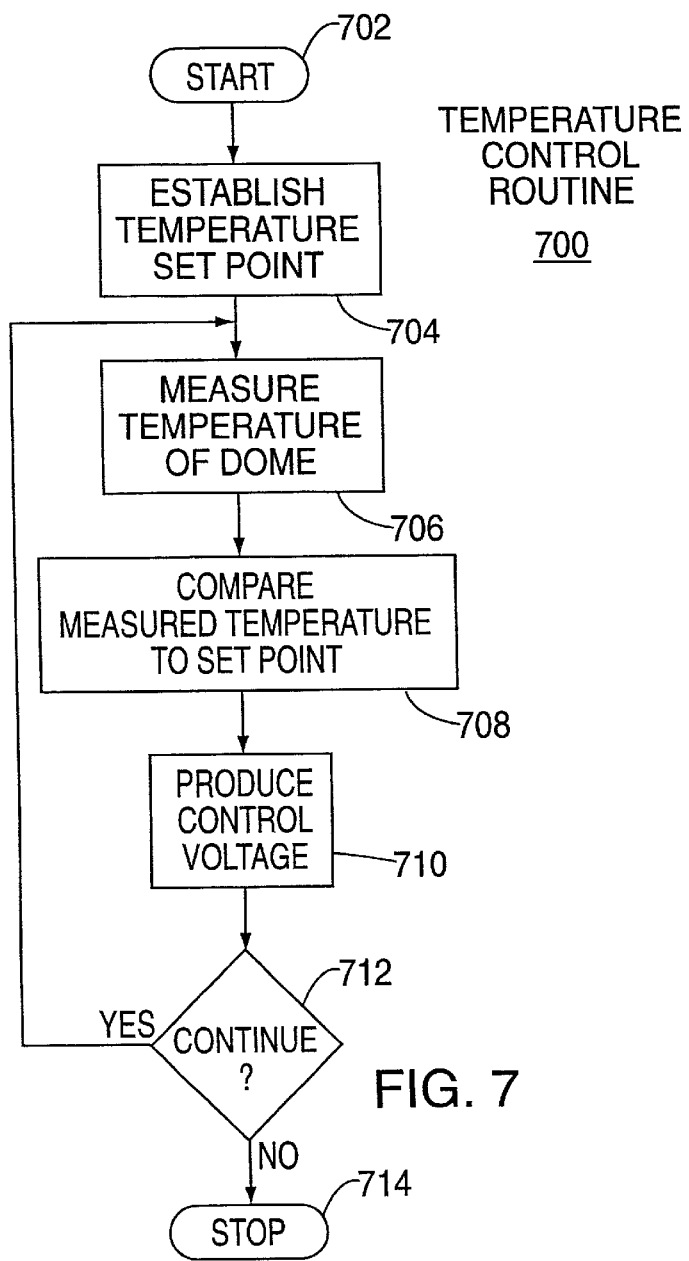
FIG. 7 depicts a flow diagram of a software implementation of a routine for controlling the dome temperatures.
Figure 8:
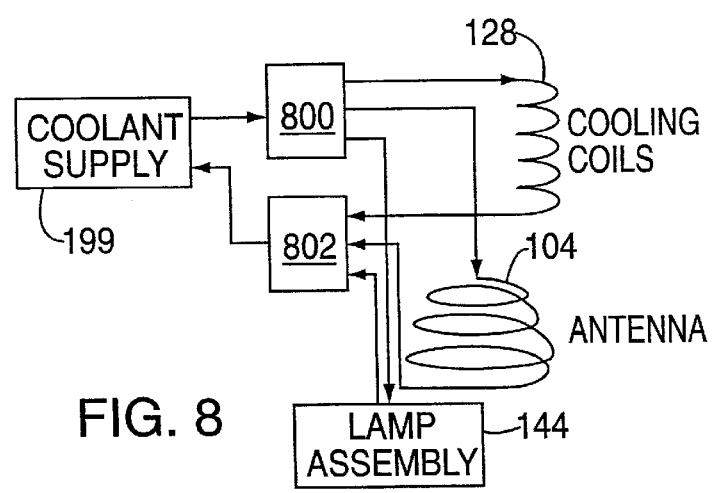
FIG. 8 depicts a schematic diagram of the coolant flow through the apparatus of the present invention.

FIG. 7 depicts a flow diagram of the temperature control routine 700 as implemented in software and executed by the computer. Routine 700 begins at step 702 and proceeds to step 704. At step 704, the routine establishes a temperature set point. This value is typically entered by a user through a keyboard. At step 706, the routine measures the dome temperature, e.g., reads the digitized temperature measurement produced by the A/D converter. At step 708, the measured temperature is compared to the set point temperature to produce an error value. The error value is used at step 710 to produce a lamp driver control voltage that will bring the measured temperature nearer the set point temperature. At step 712, the routine queries whether the routine should continue. If the query is affirmatively answered, the routine returns to step 706 to continue the temperature control process. However, if the query is negatively answered, the routine stops at step 714.

FIG. 8 depicts a schematic diagram of the coolant flow through the inventive apparatus. The coolant supply 199 is coupled to an inlet distribution manifold 800 and an outlet distribution manifold 802. The inlet distribution manifold 800 distributes the coolant flow to the heat exchanger coil 128, the antenna coils 104 (optional) and the lamp cooling plate 144. The coolant flow from these cooling elements is coupled to manifold 802 and, ultimately, back to the coolant supply 199.

Although the foregoing description disclosed a coolant flow, the invention may utilize a heated heat transfer fluid that would raise the temperature of the air and the dome. As such, the invention should be broadly interpreted to encompass both heating and cooling of the air within the closed loop system.

In a second embodiment of the invention, the inventive apparatus confines the air flow to an axial path or downward laminar flow of air from the fan to the dome and the air flows evenly over the exterior surface dome toward the heat exchange chamber. This configuration maximizes the convective cooling of the dome material.

Figure 9:
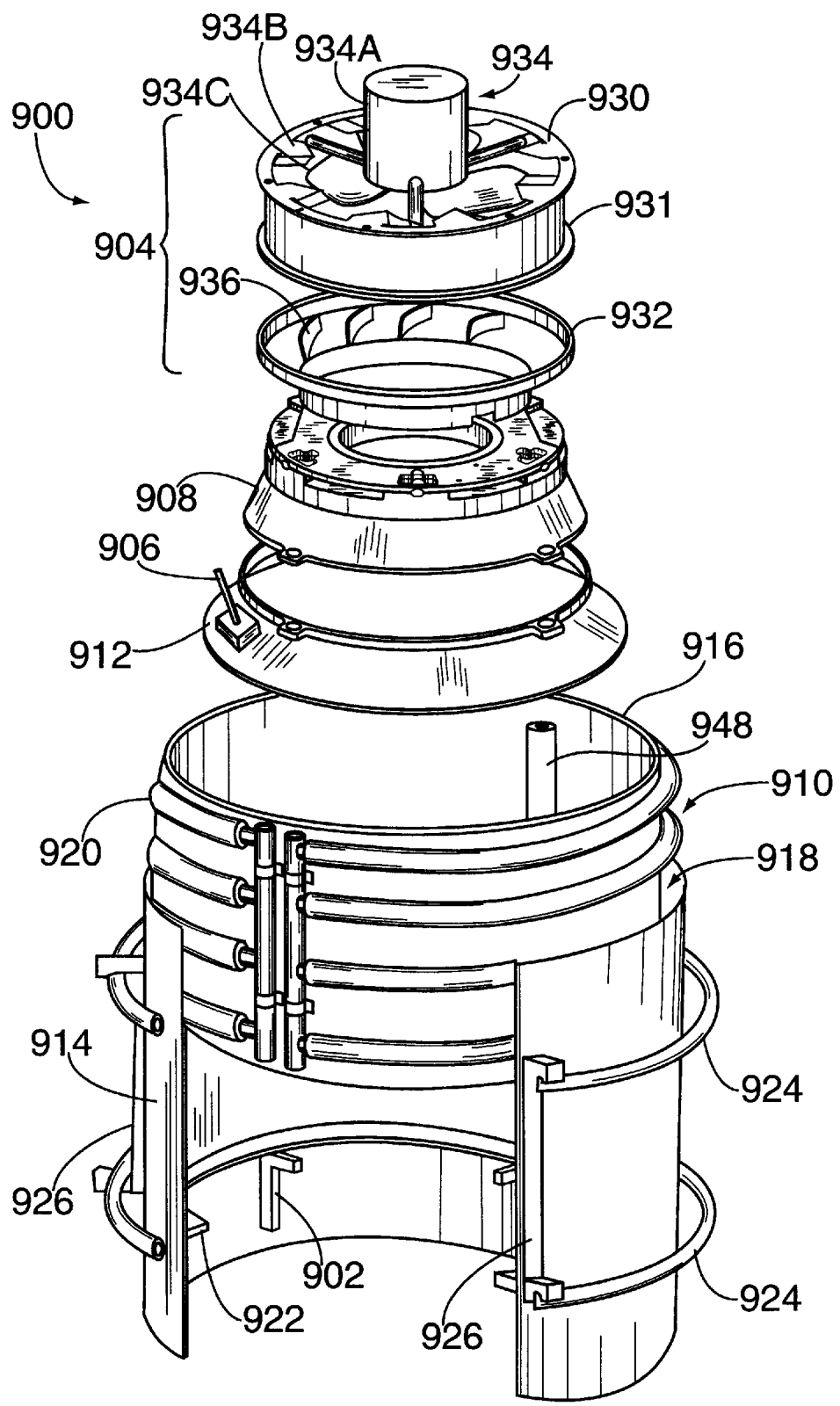
FIG. 9 depicts a partially sectional, exploded view of a second embodiment of the present invention.
Figure 10:
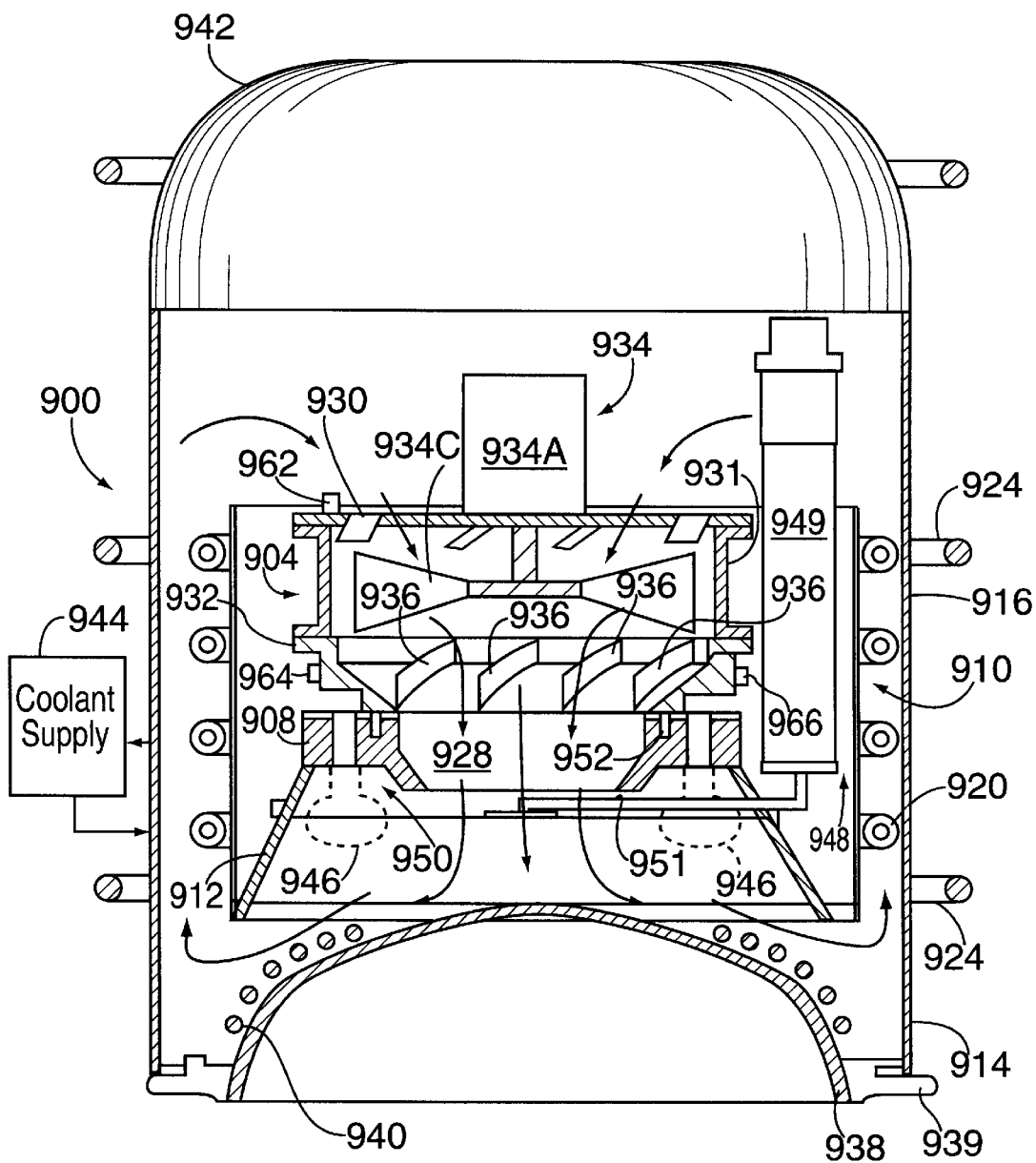
FIG. 10 depicts a cross-sectional view of a second embodiment of the present invention.

FIG. 9 depicts a partial section, exploded view of an alternative embodiment of the closed-loop dome temperature control apparatus 900 of the second embodiment of the present invention. FIG. 10 depicts an assembled, cross-sectional view of the closed-loop, dome temperature control apparatus 900 showing the airflow paths through the apparatus as a plurality of arrows. To best understand the invention, the reader should simultaneously refer to both FIGS. 9 and 10.

The apparatus 900 is mounted above a conventional ceramic dome 938 of a plasma etch reaction chamber. As with the previous embodiment, the dome 938 is circumscribed by a inductive coil 940, e.g., an antenna, that is dimensionally controlled by insulative coil mounts 902. The coil is conventionally driven with RF power to generate a magnetic plasma field within the reaction chamber to perform the etching process. The present invention maintains the surface of the dome at a relatively constant temperature whether the plasma is present or not.

More specifically, the apparatus 900 comprises an axial fan module 904, an infrared sensor 906, a lamp assembly 908, a heat exchange chamber 910, and a baffle 912. The apparatus has an outer housing 914 that is substantially cylindrical and is attached to the circumferential edge of the etch reaction chamber (not shown) by a fastener assembly 939. To assist lifting and alignment of the invention with respect to the dome, a pair of hand-holds 924 are attached to the outer surface of the outer housing by a plurality of brackets 926. The apparatus also contains a cylindrical shaped inner housing 916 that has a slightly smaller diameter than the outer housing 914. The inner and outer housings are coaxial with respect to a central axis passing through the apparatus. The inner and outer housings are in a spaced-apart relationship to define a space 918 therebetween. Within the space 918 is mounted a plurality of finned heat exchanger tubes 920 such that the outer housing, inner housing and tubes form the heat exchange chamber 910. The finned tube assembly provides greater surface area to permit more substantial convective cooling or heating of the air within the chamber.

Upon the top edge of the outer housing is mounted a fan cover 942 that forms a closed enclosure for the entire apparatus i.e., air circulating in the apparatus is not exhausted from the apparatus. Within the enclosure, the other components of the invention are mounted to a mounting ring 922 that is affixed to the inner surface of the outer housing 914. The components are stacked upon the mounting ring 922 in the following order: the baffle 912 rests upon the mounting ring 922, a lamp module 908 is affixed to the baffle 912, and the fan module 904 is affixed to the lamp assembly 904. In this arrangement, the fan module 904 pulls air through the heat exchange chamber 910 and into fan module 904 to cause air to flow axially through the lamp assembly 908 and baffle 912

Figure 13:
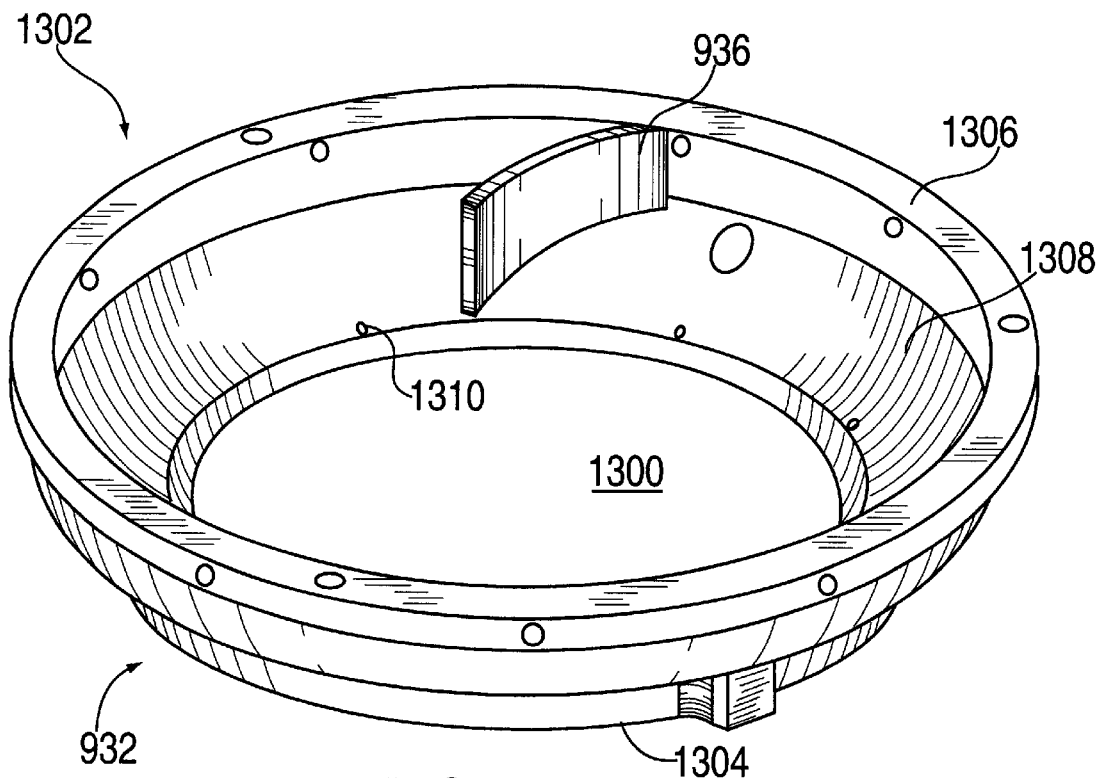
FIG. 13 depicts a perspective view of an lower stator.

The fan module 904 pulls air from the chamber 910 at approximately 350 cfm. The fan module 904 contains a fan 934 (motor 934A, mounting bracket 934B and impeller 934C), an upper stator 930, a fan cowling 931 and a lower stator 932. The fan, illustratively, is an axial flow fan produced by Kooltronics Inc. Without back pressure, such a fan can propel air at 800 cfm at zero inches of mercury. The fan forces air downward through a central aperture 928 defined by the lower stator 932 and the lamp assembly 908. The lower stator contains a plurality of air directing stator blades 936 that direct the fan's air flow from both a linear and radial velocity into an axial downward direction. The lower stator 932 is disclosed in detail with respect to FIGS. 13 and 14 below. The air, upon impact with the center of the dome 938, then evenly flows radially outward over the top surface of the dome 938 and into the heat exchange chamber 910. The airflow directional system evenly distribute the air flow thereby maximizing the dome cooling efficiency. The air rises through the chamber 910 due to the negative pressure established by the fan 934. To achieve sufficient cooling (or heating), the finned tubes (discussed below in detail with respect to FIG. 18) are provided heat transfer fluid (e.g., water) from a fluid supply 944. Generally, to cool the air and dome, the fluid is simply a steady flow of facilities water having a temperature of approximately 22° C. Importantly, this invention has the ability to maintain a continuous dome temperature with heat transfer fluid temperature as high as 35° C. The coolant is supplied at a flow rate of approximately 0.4 to 0.6 gal/min. Generally, in the first embodiment of the invention an independent heat exchanger supplies temperature regulated heat transfer fluid to the dome temperature control unit where the second embodiment of the invention omits this requirement.

Figure 12:
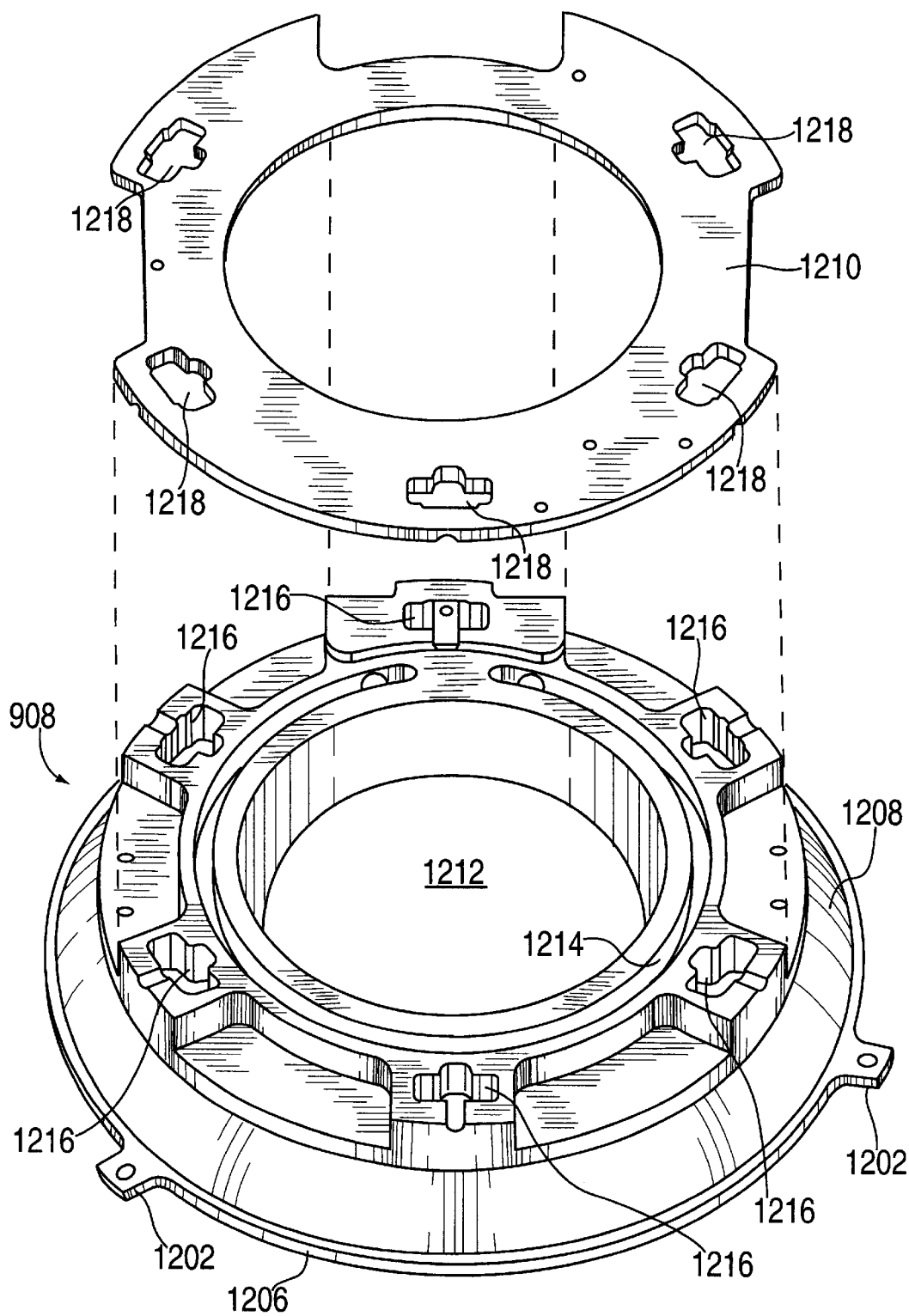
FIG. 12 depicts an exploded perspective view of a lamp assembly.

To provide further cooling of the system, the heat transfer fluid is also channeled through the lamp assembly 908 as shall be discussed in detail with respect to FIG. 12. In general, the coolant flows through a cooling jacket 952 within the lamp assembly 908. As such, the base of the lamps 946 are maintained at a relatively low temperature. For easy assembly and disassembly of the apparatus, the heat transfer fluid is provided to the lamp assembly via "quick disconnect" fittings and power is supplied to the lamps through easy disconnect connections on the wire harness.

Once chilled, the fan 934 draws the air from the heat exchange chamber 910 and forces the air through the lower stator 932 and the center of the lamp assembly 908 to complete a closed-loop air flow path. The upper stator prevents reverse air flow from the axial fan blade from interfering with the efficient circulatory air flow pattern. The air flow system delivers a uniform channel of air to the center of the dome and then radial laminar flow to the outside portion of the dome, creating greater, and more uniform, air flow over the dome surface.

An additional component that is shown but does not form a portion of the present invention is the RF conductor 948 (i.e., an RF feedthrough) that couples RF power from a matching network, located within the cover 942, to the coil 940. The feedthrough 948 is completely shielded along portion 949, i.e., the portion that is outside of the baffle 912 to prevent electrical noise on adjacent electrical components. The portion 951 of the feedthrough within the baffle 912 is generally an unshielded conductor. Importantly, wire harnesses, electronic circuits and sensors are totally shielded from RF energy field to prevent electronic interference on system control circuitry. The fan-lamp-baffle assembly functions as an RF shield that confines the RF radiation from the antenna coil to the space within the fan-lamp-baffle assembly. Consequently, RF interference with the electronic circuitry is substantially reduced.

Figure 11:
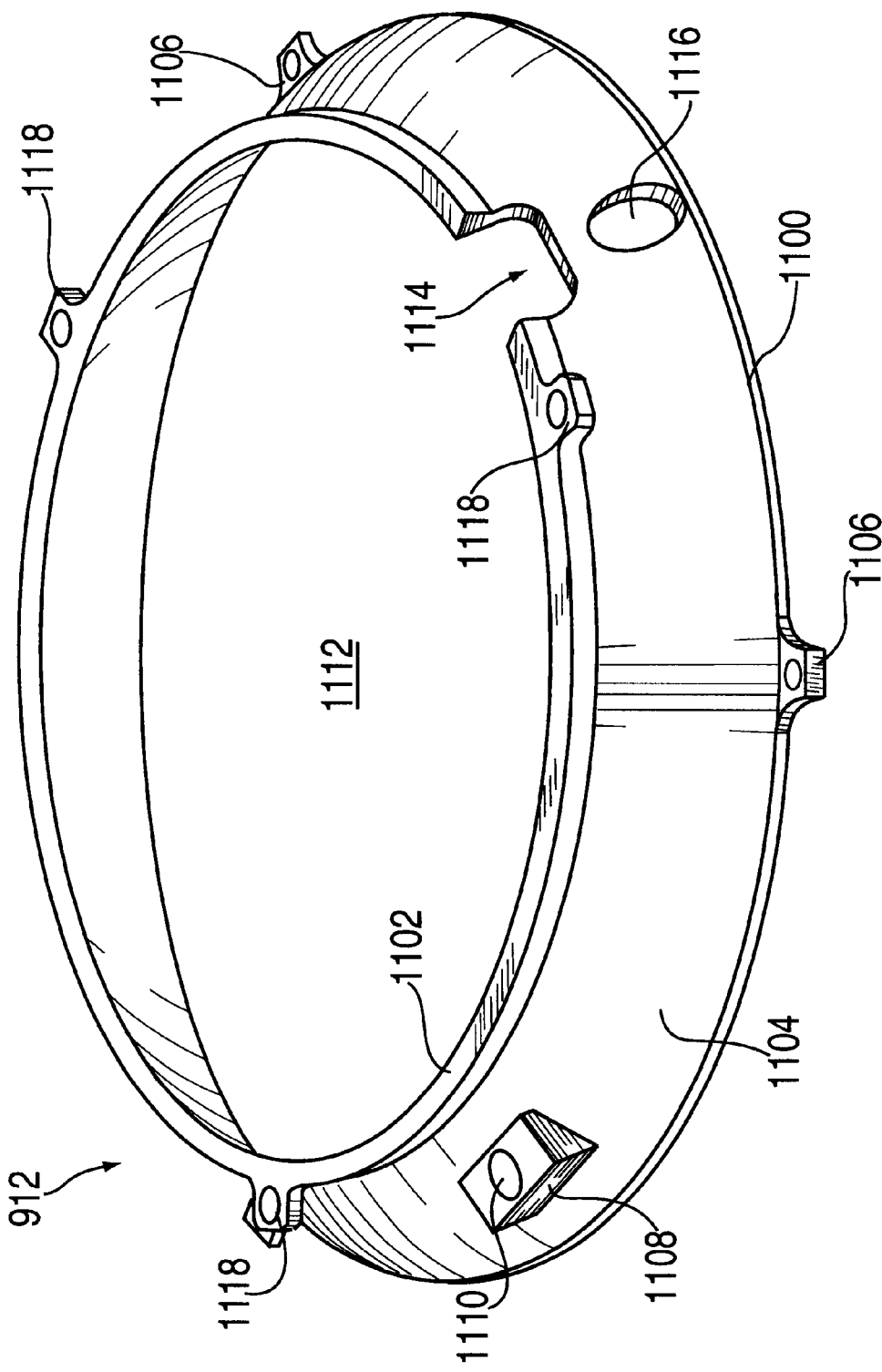
FIG. 11 depicts a perspective view of a baffle.

FIG. 11 depicts a perspective view of the baffle 912. The baffle 912 has a lower mounting flange 1100, an upper mounting flange 1102 and a sloped wall portion 1104 connecting the upper mounting flange 1102 to the lower mounting flange 1100. The baffle 912 defines a central aperture 1112 through which air flows toward the dome. The lower mounting flange 1100 contains a plurality of mounting extensions 1106 for affixing the baffle 912 to the mounting ring (922 of FIG. 9), generally by using bolts. Similarly, the upper mounting flange 1102 contains a plurality of extensions 1118 for affixing the baffle 912 to the lamp assembly (908 of FIG. 9), generally by using bolts. The sloped portion 1104 of the baffle 912 extends inwardly from the lower mounting flange 1102 to the upper mounting flange 1104 at an angle of approximately 55 degrees relative to horizontal. Approximately half way along the sloped portion 1104 is a sensor mount 1108. The sensor mount contains a mounting bore 1110 that is angle at approximately 58 degrees relative to horizontal. With the sensor mounted through the baffle 912, the infrared sensor senses an area of about 1.8 inches in diameter on the surface of the dome. This provides an accurate indication of the surface temperature of the dome for use by the temperature control electronics. The baffle 912 also contains a notch 1114 and an aperture 1116 that facilitate routing the RF conductor through the baffle 912 to the coil.

FIG. 12 depicts an exploded, perspective view of the lamp assembly 908. The lamp assembly 908 is affixed to the baffle by a plurality of extensions 1202 protrude from the mounting flange 1206. The lamp assembly has two principal components (other than the electrical wiring and the bulbs which are not shown). The first component is the base 1208 and the second component is the cover 1210. The base 1208 is milled from a solid block of aluminum to form a reflector for the plurality of bulbs (shown as 950 in the cross section of FIG. 10), the central air flow aperture 1212, a coolant channel 1214, and a plurality of bulb sockets 1216. The sides of the reflector are sloped at approximately 60 degrees and these surface are gold plated to enhance reflectivity. The cover 1210 contains sockets 1218 that match the sockets 1216 in the base 1208. To assemble the lamp assembly, the cover 1210 is positioned over the base 1208, the sockets are aligned and the cover and base are braised to one another. As such, the cover 1210 and channel 1214 form a conduit (i.e., coolant jacket 951 in FIG. 10) for carrying coolant through the lamp assembly 908. Preferably there are six bulb sockets evenly distributed about a 7.5 inch radius relative to the center of the assembly. The reflector shape as well as bulb placements provides efficient delivery of the IR energy to uniformly heat the dome.

FIGS. 13 through 17 depict detailed perspective views of the various components of the fan assembly 904. For best understanding of the invention, the reader should simultaneously refer to FIGS. 13–18.

As mentioned above with respect to FIGS. 9 and 10, the fan assembly 904 contains a fan 934 (motor, impeller and mounting bracket), an upper stator 930 and a lower stator 932. The upper and lower stators are separated from one another by a fan cowling 931.

The lower stator 932 (shown in FIG. 13) defines a central aperture 1300 that, when the lower stator 932 is affixed atop the lamp assembly, the aperture 1300 is aligned with the central air flow aperture of the lamp assembly. The stator 932 contains a plurality of stator blades 936 (one of which is shown) positioned about the inner circumference of the stator 932. Each of those blades 936 is curved to perform the air flow control that maintains an axial air flow through the central aperture 1300 and uniformly distributes the air to the dome surface. In essence, the lower stator 932 focuses the air flow from the fan onto the center of the dome. Consequently, this axial flow of air moves radially across the dome toward the dome's edge and convectively cools the entire dome.

More specifically, the stator 932 contains a blade mounting ring 1302 and a plurality of blades 936. The blade mounting ring 1302 is milled from a block of aluminum to contain a vertical portion 1304 for mounting to the upper surface of the lamp assembly, a mounting flange 1306 for supporting the fan cowling 931 and defining the central aperture 1300, and a slanted portion 1308 for interconnecting the vertical portion 1304 with the flange 1304. The slanted portion 1308 is slanted inward at approximately 45 degrees from vertical. The fan cowling, stator ring and lamp housing are sized appropriately to deliver the maximum airflow to the dome surface. The vertical portion 1304 and the flange 1306 contain a plurality of mounting holes for respectively attaching the stator 932 to the fan cowling and the lamp assembly. The slanted portion 1308 contains a plurality of blade mounting holes 1310 (e.g., nine holes) formed and evenly distributed about the inner edge circumference of the slated portion 1308. Each hole maintains a blade 936 in a particular orientation that is described in detail below.

Figure 14:
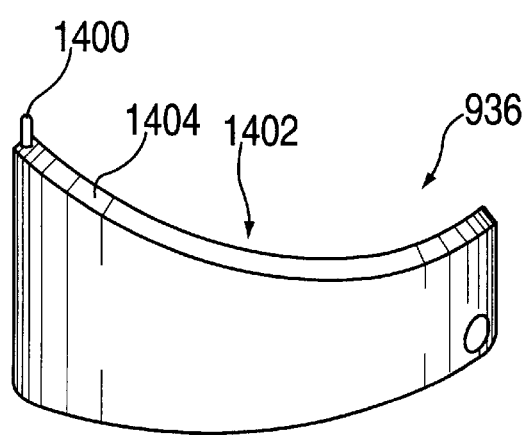
FIG. 14 depicts a perspective view of a lower stator blade.

As shown in FIG. 14, each blade 936 has a pin 1400 extending from edge 1404 for locating the blade onto the mounting ring 1302. The pin 1400 is press fit into the mounting holes 1310. Each blade is formed with a radius curvature 1402 that is 10% of the radius of the lamp assembly aperture 936. The curvature is important to redirect the air flow velocity from a radial direction to a conically linear flow to uniformly blanket the dome surface. When affixed to the mounting ring 1302, an edge 1404 abuts slanted surface 1308. As such, the orientation and curvature of the blades about the center aperture 1300 of the stator 936 maintains the axial air flow toward the dome.

Figure 15:
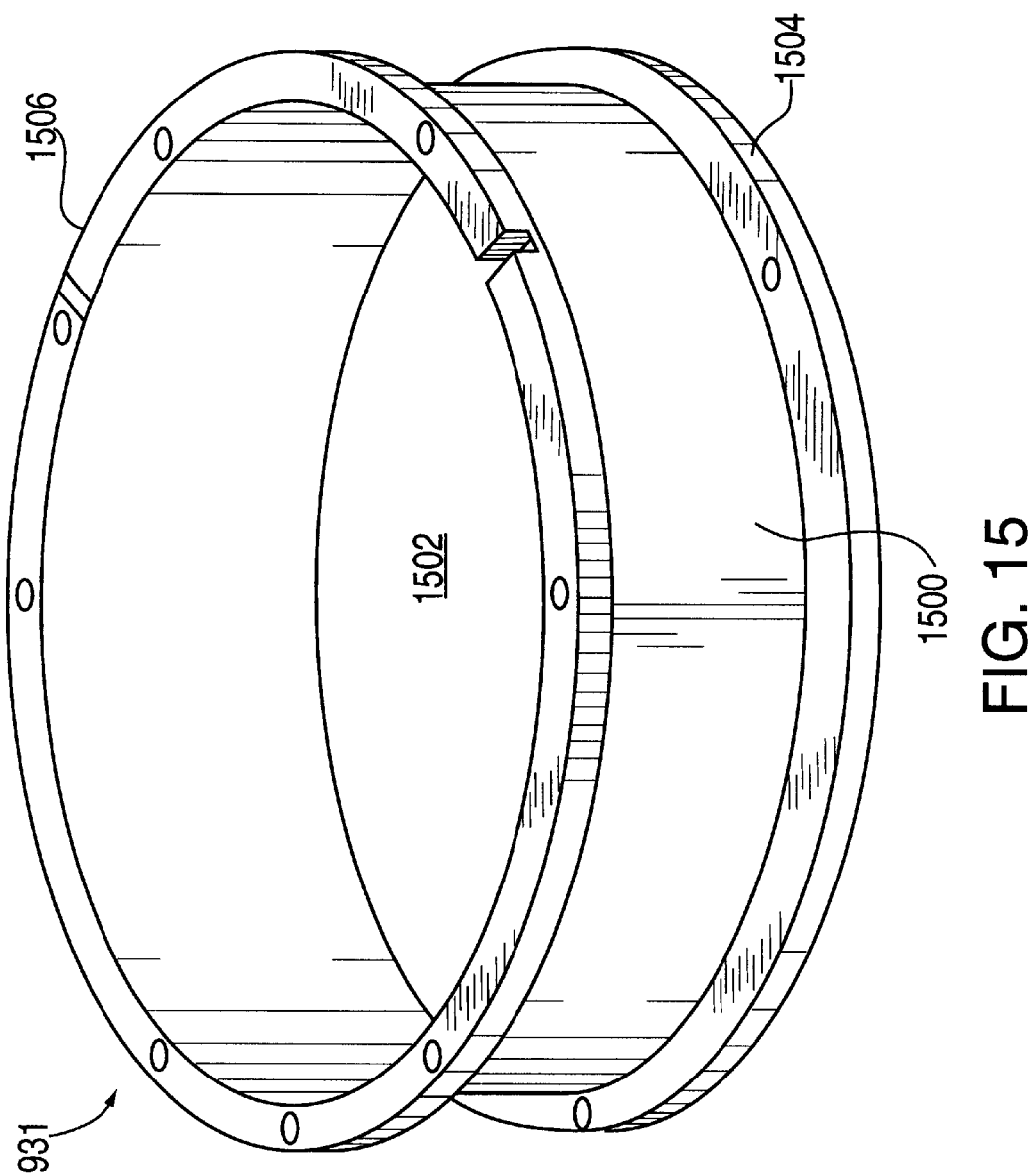
FIG. 15 depicts a perspective view of a fan cowling.

The lower stator 932 is affixed to the fan cowling 931 shown in FIG. 15. The cowling 931 is a cylinder 1500 that defines a central aperture 1502. The upper and lower edges of the cylinder 1500 are terminated with peripheral mounting flanges 1504 and 1506. These flanges have mounting holes to facilitate affixing the upper and lower stators to the cowling. Additionally, the fan mounting bracket (not shown) is affixed to the upper flange 1506 to maintain the fan in a centrally located position within the cowling.

Figure 16:
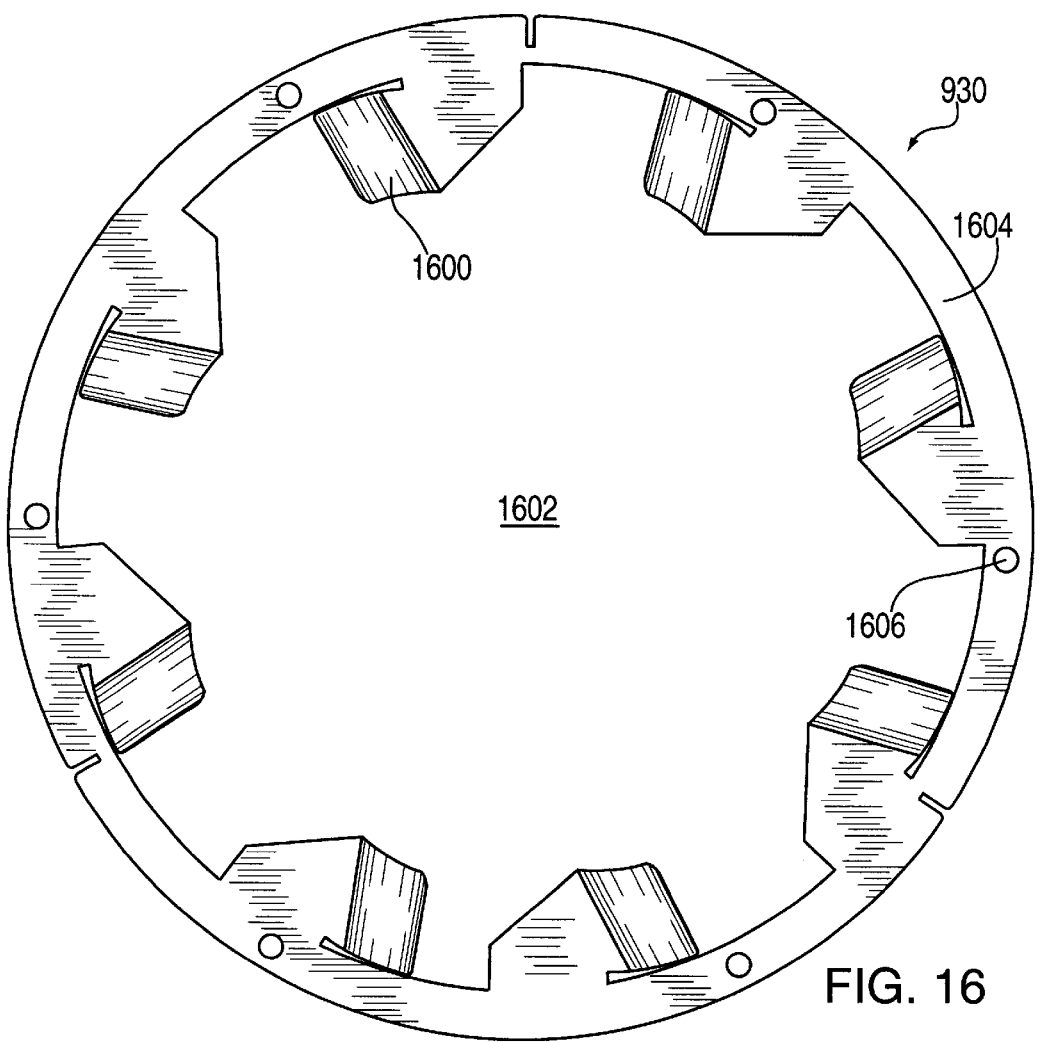
FIG. 16 depicts a top plan view of an upper stator.
Figure 17:
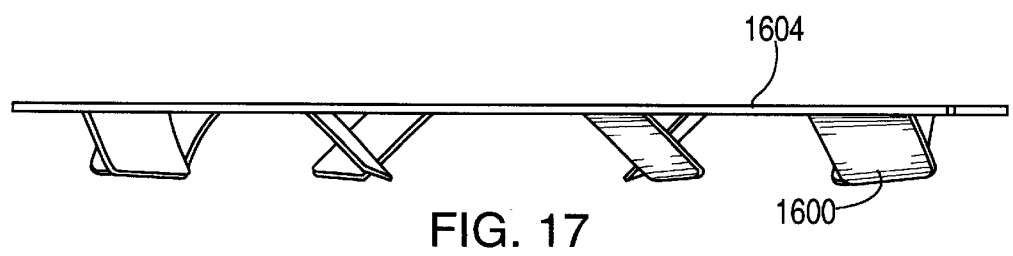
FIG. 17 depicts a side view of the upper stator.

FIG. 16 depicts a top plan view of the upper stator 930 and FIG. 17 depicts a side plan view of the upper stator 930. The upper stator 930 is a die-cut sheet of metal containing a plurality of stator blades 1600 that circumscribe a central aperture 1602. Specifically, the stator 930 contains a mounting ring 1604 having a plurality of blades 1600 (e.g., eight) extending inwardly therefrom. The mounting ring contains a pattern of mounting holes 1606 for affixing the upper stator 930 to the cowling 931. The stator blades extend tangential to the inner circumference of the mounting ring 1604. Each blade 1600 is approximately 1.75 inches wide and is bent downward toward the fan at an angle of 25 degrees ±15% of the angle. The blades extend in a direction that is opposite the direction of rotation of the fan. The upper stator 930 reduces the back flow that would otherwise occur within the closed loop cooling system. As such, the upper stator, by reducing the back flow, significantly enhances the air flow toward the dome.

Figure 18:
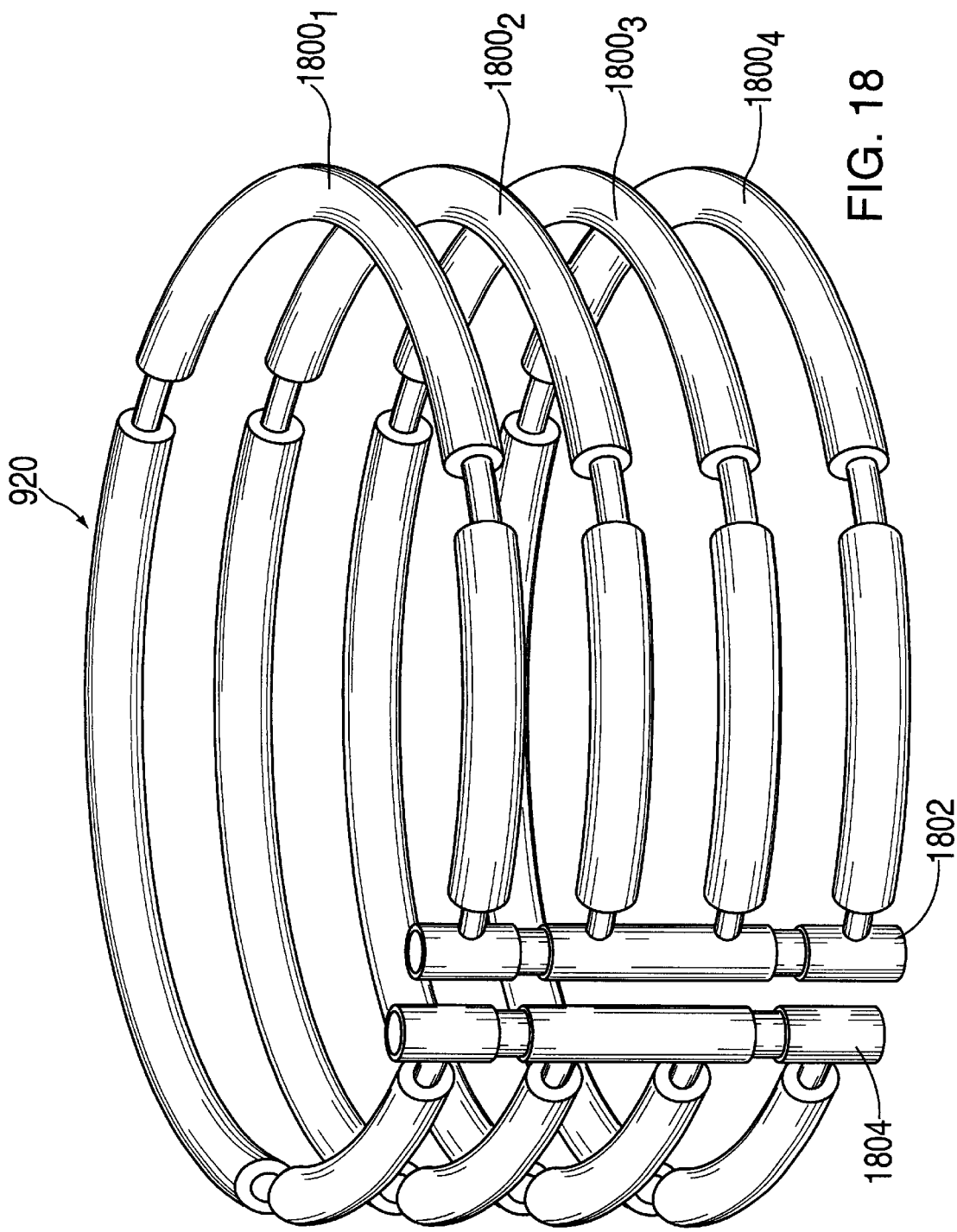
FIG. 18 depicts a perspective view of the cooling tubes.

FIG. 18 depicts a perspective view of the coiling tubes 920 that chill the air flowing through the cooling chamber. The tubes 920 have a 0.375 inch inner diameter and are arranged as a plurality of circular loops $1800_n$ (where n is an integer greater than or equal to one) that begin at an inlet manifold 1802 and terminate into an outlet manifold 1804. The tubes are generally brazed to the manifolds. Each tube contains a thermally conductive conduit with a plurality of thermally conductive radial fins extending from the surface of the conduit. As such, the finned tubing provides a substantial surface area such that a substantial amount of heat can be removed form the air flowing across the tubes.

As with the first embodiment of the invention, the second embodiment of the invention also features a number of safety interlocks that are implemented to avoid injury or damage to the hardware. For example, in FIG. 10, an airflow photoelectric sensor 962 is provided to trigger a shut-down of the RF power and the heating lamps in the event of a fan failure. In addition, there are two over temperature sensors 964 and 966, located on the lamp assembly 908, which trigger the shut-down of the RF power and the lamp power in the event of overheating of the dome temperature control system. Furthermore, there is at least one interlock switch 960 (and, generally, there are three) that senses removal or improper seating of the fan cover 942. As such, removal or improper seating of the cover triggers a shut-down of the RF power, lamp power and the high voltage supply to the electrostatic chuck that retains a wafer within the etch chamber. All of the interlock switches are positioned at a distance from the RF antenna and are located outside of the fan-lamp-baffle assembly such that the RF field does not interfere with the operation of the interlock switches or the circuitry related with the switches. The electrical circuitry of the second embodiment of the invention is substantially similar to the schematic diagram of FIG. 6.

Using the apparatus of either the first or second embodiments of the present invention, the dome is designed to be maintained at a temperature of ±10° C. about a nominal temperature of 65–80° C. However, experimentally using the apparatus of the present invention, dome temperatures have been maintained within ±5° C. with energy removal of approximately 1200 watts.

Figure 19:
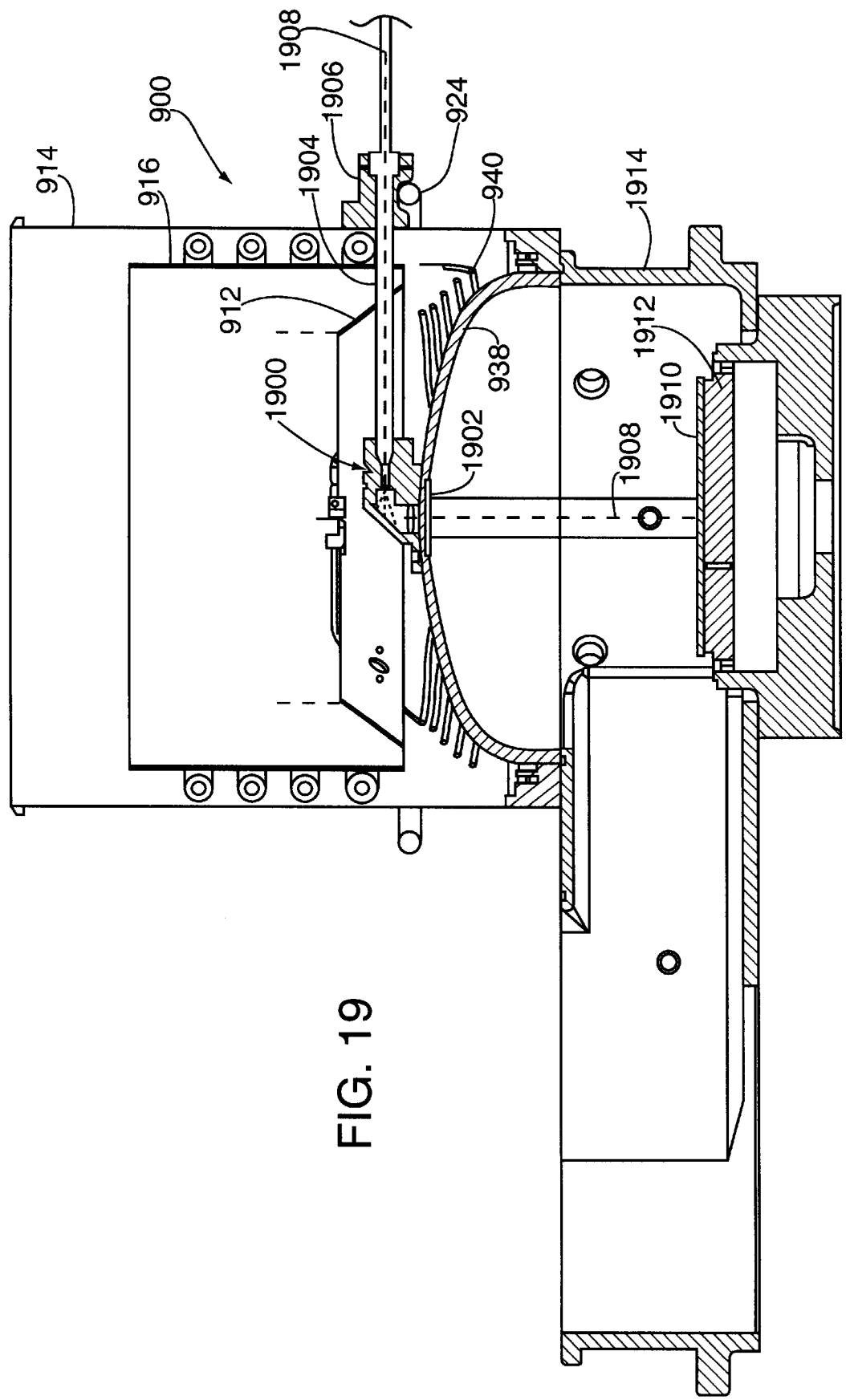
FIG. 19 depicts a cross-sectional view of an end-point detector incorporated into the apparatus of the present invention.

FIG. 19 depicts a cross-sectional view of an end-point detector 1900 incorporated into the apparatus of the present invention. Generally, end-point detectors are used to monitor the progress of a process being performed within the reaction chamber 1914. The depicted end-point detector 1900 is uniquely coupled to a transparent window 1902 located near the apex of the dome 938. The window is, for example, transparent to visible and/or ultraviolet light. The detector 1902 is connected to the exterior of the temperature control apparatus 900 through a fiber optic conductor 1904. The conductor 1904 passes through an aperture in the baffle 912, the inner housing 916 and the outer housing 914. a conductor support 1906 is mounted to the exterior of the housing 914 to provide a seal surrounding the conductor 1904.

In operation, a laser beam 1908 (or other source of measuring signal) is coupled to the optical fiber conductor, the light passes through the detector 1900. The detector collimates the light and directs t;he beam toward a wafer 1910 supported by a wafer pedestal 1912 within the reaction chamber 1914. The beam reflects from the wafer surface and propagates back through the detector 1900 to the conductor 1904. Ultimately, the reflected beam is compared to the transmitted beam to determine process status. This form of end-point detector is disclosed in commonly assigned U.S. patent application Ser. No. 08/944,240, filed Oct. 6, 1997 and herein incorporated by reference.

To incorporate this form of end-point detector into the present invention, the baffle must support the lamp assembly at a distance from the dome to enable the detector to be mounted centrally upon the dome. Such a central mounting location provides an optimal field of view for the detector.

Additionally, the lamps must be spaced about the detector such that the detector does not interfere with the uniform heating of the chamber environment. The optical feedthrough, e.g. conductor 1904 and support 1906, are generally fabricated from dielectric materials to prevent interference with the RF fields produced by the antenna coil 940. In addition, the use of dielectric materials provides a safety feature to prevent hazardous RF shock or burns due to charging of the optical system.

Although various embodiments which incorporate the teachings of the present invention have been shown and described in detail herein, those skilled in the art can readily devise many other varied embodiments that still incorporate these teachings.

What is claimed is:

1. Apparatus for thermally controlling the temperature of a dome of a reaction chamber within a semiconductor processing system, the dome including a dome axis, the apparatus comprising:

a fan, mounted proximate the dome, for blowing air over a surface of the dome, wherein said dome defines a lower surface of an enclosed space;

a vortex generator positioned substantially above the dome, the vortex generator generating a vortex flow that is substantially parallel to the dome axis and is directed towards the dome, the vortex generator is mounted between said fan and said dome; and a heat exchange chamber, within an airflow path of said air being blown by said fan, for altering the temperature of said air.

2. The apparatus of claim 1 further comprising:

an enclosure for enclosing said fan and heat exchange chamber, where said air within said enclosure is recirculated by said fan over said dome and through said heat exchange chamber.

3. The apparatus of claim 1 wherein said vortex generator further comprises a nozzle ring containing a plurality of air directing nozzles.

4. The apparatus of claim 3 wherein each of the air directing nozzles contains an exhaust aperture that is oriented to have a central axis thereof tangent to a circle having a predefined radius, where the circle is centrally located above the dome.

5. The apparatus of claim 1 further comprising a lamp assembly having a plurality of heating lamps, where the intensity of the heating lamps are controlled by a lamp controller.

6. The apparatus of claim 1 wherein said heat exchange chamber contains heat transfer coils connected to a heat transfer fluid supply.

7. The apparatus of claim 6 wherein said heat transfer fluid supply is coupled to a hollow RF antenna coil to provide a coolant flow through said RF antenna coil.

8. The apparatus of claim 5 wherein said heating lamps are supported by the lamp assembly that is coupled to a heat transfer fluid supply for cooling said lamps.

9. The apparatus of claim 1 wherein the vortex generator further comprises a lower stator mounted between said fan and said dome, for generating the vortex flow.

10. The apparatus of claim 9 wherein said air direction generator further comprises a blade mounting ring containing a plurality of air directing stator blades.

11. The apparatus of claim 9 further comprising an upper stator, positioned above said fan, for reducing a back flow of air.

12. The apparatus of claim 9 further comprising a lamp assembly having a plurality of heating lamps, where the intensity of the heating lamps are controlled by a lamp controller.

13. The apparatus of claim 9 wherein said heat exchange chamber contains a plurality of heat transfer tubes coupled to a heat transfer fluid supply.

14. The apparatus of claim 12 wherein said heating lamps are supported by a lamp assembly that is coupled to a heat transfer fluid supply for cooling said lamps.

15. Apparatus for thermally controlling the temperature of a dome of a reaction chamber within a semiconductor processing system, the dome comprising a dome axis, the apparatus comprising:
   a fan, mounted proximate the dome, for blowing air over the dome, wherein said dame defines a lower surface of an enclosed space; and
   a vortex generator positioned substantially above the dome, the vortex generator mounted between said fan and said dome, for producing an air vortex over said dome, the air vortex having a vortex flow by is oriented substantially parallel to the dome axis.

16. The apparatus of claim 15 wherein said vortex generator further comprises a nozzle ring containing a plurality of air directing nozzles.

17. The apparatus of claim 16 wherein each of the air directing nozzles contains an exhaust aperture that is oriented to have a central axis thereof tangent to a circle having a predefined radius, where the circle is centrally located above the dome.

18. The apparatus of claim 15 further comprising:
   a heat exchange chamber, within an airflow path of said air being blown by said fan, for altering the temperature of said air; and
   an enclosure for enclosing said fan and heat exchange chamber, where said air is recirculated by said fan over said dome and through said heat exchange chamber.

19. Apparatus for thermally controlling the temperature of a dome of a reaction charter within a semiconductor processing system, the dome comprising a dome axis, the apparatus comprising:
   a hollow RF antenna coil, mounted proximate said dome, for coupling RF fields into an atmosphere within said reaction chamber;
   a vortex generator generating an air vortex having a vortex flow that is substantially parallel to the dome axis and is directed towards the dome, the hollow RF antenna coil is mounted between said vortex generator and said dome, wherein said dome defines a lower surface of an enclosed space; and
   a heat transfer fluid supply, coupled to said hollow RF antenna coil, for providing heat transfer fluid to an interior space of said RF antenna coil and thereby altering the temperature of said dome.

20. The apparatus of claim 19 further comprising:
   a fan, mounted proximate said dome, for blowing air over the dome;
   a heat exchange chamber, within a recirculated airflow path of said air being blown by said fan, for altering the temperature of said air; and
   an enclosure for enclosing said fan and heat exchange chamber, the enclosure defining a portion of the recirculated airflow path, where said air is recirculated by said fan after the air has passed over said dome and through said heat exchange chamber.

21. The apparatus of claim 20 wherein said heat exchange chamber further comprises a heat transfer coil coupled to said heat transfer fluid supply.

22. The apparatus of claim 19 further comprising a lamp assembly, mounted proximate said dome, for heating said dome, where said heat transfer fluid supply is coupled to said lamp assembly to cool the lamp assembly.

23. Apparatus for thermally controlling the temperature of a dome of a reaction chamber within a semiconductor processing system, the apparatus comprising:
   a fan, mounted proximate the dome, for blowing air over the dome, wherein said dome defines a lower surface of an enclosed space;
   a heat exchange chamber, within an airflow path of said air being blown by said fan, for altering the temperature of said air;
   an enclosure for enclosing said fan and heat exchange chamber, where a substantial portion of said air is recirculated by said fan over said reaction chamber dome and through said heat exchange chamber;
   at least one sensor for measuring operational parameters of the heat exchange chamber and deactivating said semiconductor processing system when said measured operational parameters exceed nominal operational parameters; and
   an enclosure sensor, proximate said enclosure, for identifying when said enclosure is improperly aligned or removed, where said enclosure sensor deactivates said semiconductor processing system when said enclosure sensor indicates the enclosure is improperly aligned or removed.

24. The apparatus of claim 23 wherein said sensor is a temperature sensor for measuring air temperature within the enclosure.

25. The apparatus of claim 23 wherein said sensor is an air flow sensor for measuring air flow within the enclosure.

26. Apparatus for thermally controlling the temperature of a dome of a reaction chamber within a semiconductor processing system, the apparatus comprising:
   a fan, mounted proximate the dome, for blowing air over the dome, wherein said dome defines a lower surface of an enclosed space;

an air flow director, mounted between said fan and said dome for producing a uniform air flow toward said dome; and a cowling surrounding said fan.

27. The apparatus of claim 26 wherein said air flow director further comprises a blade mounting ring containing a plurality of air directing stator blades.

28. The apparatus of claim 26 further comprising:

a heat exchange chamber, within an airflow path of said air being blown by said fan, for altering the temperature of said air; and an enclosure for enclosing said fan and heat exchange chamber, where said air is recirculated by said fan over said dome and through said heat exchange chamber.

29. The apparatus of claim 26 further comprising a stator, positioned above said cowling, for reducing back-flow of air from said fan.

30. The apparatus of claim 28 further comprising:

a heat exchange chamber, within an airflow path of said air being blown by said fan, for altering the temperature of said air; and an enclosure for enclosing the baffle, lamp assembly, lower stator, fan cowling, fan, upper stator and heat exchange chamber, where said air is recirculated by said fan over said dome and through said heat exchange chamber.

31. The apparatus of claim 30 wherein said heat exchange chamber circumscribes said baffle, lamp assembly, lower stator, fan cowling, fan, and upper stator, where air flows axially through the baffle, lamp assembly, lower stator, fan cowling, fan, and upper stator, then radially over the dome and vertically through said heat exchange chamber.

32. The apparatus of claim 26 wherein said heat exchange chamber further comprises a plurality of heat transfer tubes coupled to a heat transfer fluid supply.

33. The apparatus of claim 32 further comprising a lamp assembly, mounted proximate said dome, for heating said dome, where said heat transfer fluid supply is coupled to said lamp assembly to cool the lamp assembly.

34. A method for thermally controlling the temperature of a dome of a reaction chamber within a semiconductor processing system, the dome comprising a dome axis, the method comprising the acts of:

blowing air towards the dome with a fan, wherein said dome defines a lower surface of an enclosed space; and producing an air vortex over the dome, with a vortex generator that is positioned substantially above the dome, the air vortex having a vortex flow that is oriented substantially parallel to the dome axis.

35. The method of claim 34, further comprising the acts of:

defining a recirculated airflow path including the air flow created by the fan;

altering the temperature of the air in the airflow path; and enclosing the fan and heat exchange chamber within an enclosure defining a portion of the recirculated airflow path, wherein said air is recirculated by said fan after the air has passed over said dome and through said heat exchange chamber.

36. The apparatus of claim 1 wherein said vortex generator further comprises a lower stator comprising a plurality of stationary stator blades that extend about the center aperture.

37. The apparatus of claim 1, wherein the air flow of the vortex flow across the surface of the dome is substantially laminar.

38. The apparatus of claim 1, further comprising a lamp assembly positioned proximate the dome, and extending circumferentially of the dome center, wherein the lamp assembly is mounted between the dome and the vortex generator.

39. The apparatus of claim 38, wherein the lamp assembly comprises a central air flow aperture, wherein the vortex flow directed by the vortex generator towards the dome center flows through the central air flow aperture.

40. The apparatus of claim 1, wherein said vortex generator further comprises an upper stator, the fan is positioned between the dome and the vortex generator, the fan limits a backflow of air from the fan.

41. The apparatus of claim 15, wherein said vortex generator further comprises a lower stator comprising a plurality of stationary stator blades that extend about the center aperture.

42. The apparatus of claim 15, wherein the air flow of the vortex flow across the surface of the dome is substantially laminar.

43. The apparatus of claim 15, further comprising a lamp assembly positioned proximate the dome, and extending circumferentially of the dome center, wherein the lamp assembly is mounted between the dome and the vortex generator.

44. The apparatus of claim 43, wherein the lamp assembly comprises a central air flow aperture, wherein the vortex flow directed by the vortex generator towards the dome center flows through the central air flow aperture.

45. The apparatus of claim 15, wherein said vortex generator further comprises an upper stator, the fan is positioned between the dome and the vortex generator, the fan limits a backflow of air from the fan.

46. The apparatus of claim 28 wherein said heat exchange chamber further comprises a plurality of heat transfer tubes coupled to a heat transfer fluid supply.

47. The apparatus of claim 46 further comprising a lamp assembly, mounted proximate said dome, for heating said dome, where said heat transfer fluid supply is coupled to said lamp assembly to cool the lamp assembly.

* * * * *

UNITED STATES PATENT AND TRADEMARK OFFICE
CERTIFICATE OF CORRECTION

PATENT NO. : 6,367,410 B1  
DATED : April 9, 2002  
INVENTOR(S) : Leahey et al.

It is certified that error appears in the above-identified patent and that said Letters Patent is hereby corrected as shown below:

Column 9,  
Line 65, please replace "surface" with -- surfaces --.

Column 11,  
Line 35, please replace "form" with -- from --.

Column 13,  
Line 42, please replace "dame" with -- dome --.  
Line 47, please replace "by" with -- that --.  
Line 65, please replace "charter" with -- chamber --.

Signed and Sealed this

Twenty-second Day of October, 2002

Attest:

JAMES E. ROGAN  
*Attesting Officer*  *Director of the United States Patent and Trademark Office*